United States Patent [19]
Ozaki

[11] Patent Number: 5,726,998
[45] Date of Patent: Mar. 10, 1998

[54] PARTIAL SCAN PATH TEST OF A SEMICONDUCTOR LOGIC CIRCUIT

[75] Inventor: Hideharu Ozaki, Tokyo, Japan

[73] Assignee: NEC Corporation, Tokyo, Japan

[21] Appl. No.: 364,224

[22] Filed: Dec. 27, 1994

[30] Foreign Application Priority Data

Dec. 28, 1993 [JP] Japan .................. 5-336020

[51] Int. Cl.$^6$ ............................ G01R 31/28
[52] U.S. Cl. ................ 371/22.31; 371/22.31; 371/22.5
[58] Field of Search .............. 371/22.3, 25.1, 371/22.1, 22.31, 22.32, 22.5, 27.7, 27.5; 364/488, 489–491; 324/73.1, 765; 395/183.06

[56] References Cited

U.S. PATENT DOCUMENTS

| | | | |
|---|---|---|---|
| 5,043,986 | 8/1991 | Agrawal et al. | 371/25.1 |
| 5,132,974 | 7/1992 | Rosales | 371/22.3 |
| 5,257,201 | 10/1993 | Berman et al. | 364/489 |
| 5,282,146 | 1/1994 | Aihara et al. | 364/489 |
| 5,425,034 | 6/1995 | Ozaki | 371/22.3 |
| 5,513,118 | 4/1996 | Dey et al. | 364/490 |
| 5,519,714 | 5/1996 | Nakamura et al. | 371/22.3 |

OTHER PUBLICATIONS

K. Gutfreund, "Integrating the Approaches to Structured Design for Testability", VLSI Design, Oct. 1983, pp. 34–37 and 40–42.

Primary Examiner—Robert W. Beausoliel, Jr.
Assistant Examiner—Nadeem Iqbal
Attorney, Agent, or Firm—Foley & Lardner

[57] ABSTRACT

A semiconductor logic circuit designing apparatus includes a storage section for storing a connection information of a semiconductor logic circuit to be designed, a connection determining section for determining based on the connection information whether each of control terminals of each of sequential circuits of the semiconductor logic circuit except for flip-flop circuits constituting a shift register for a partial scan path is connected to one or more of the flip-flop circuits, and a changing section for selectively changing the connection information in accordance with circuit elements connected to the output of each of the one or more flip-flop circuits to add a latch immediately after an output terminal of each of the one or more flip-flop circuits on a path between the output terminal of each of the one or more flip-flop circuits and each sequential circuit when it is determined that each control terminal of each sequential circuit is connected to the one or more flip-flop circuits.

13 Claims, 8 Drawing Sheets

PARTIAL SCAN PATH TEST OF A SEMICONDUCTOR LOGIC CIRCUIT

BACKGROUND OF THE INVENTION

1. Field of the Invention

The present invention relates to a partial scan path test, and more particularly, to a semiconductor logic circuit device including a shift register circuit for a partial scan path test and a method and apparatus for providing the semiconductor logic circuit.

2. Description of Related Art

A semiconductor logic circuit device has been widely used in various application fields. The semiconductor logic circuit device is designed based on the specification from a customer to achieve the functions requested by the customer. Therefore, when the design is ended once, it is necessary to check whether or not the requested functions can be actually achieved. However, this check is generally complicated. As the integration of the semiconductor logic circuit device is increased, the check becomes more and more complicated. In order to solve the problem, there is proposed a partial scan path test method.

In the partial scan path test of a semiconductor logic circuit, a data pattern is sequentially set into flip-flop circuits constituting a shift register for the partial scan path test and a resultant data pattern is sequentially read out from the flip-flop circuits. However, there is a problem in that the data of sequential circuits other than the flip-flop circuits change during the setting and reading of the data pattern.

Figure 1:
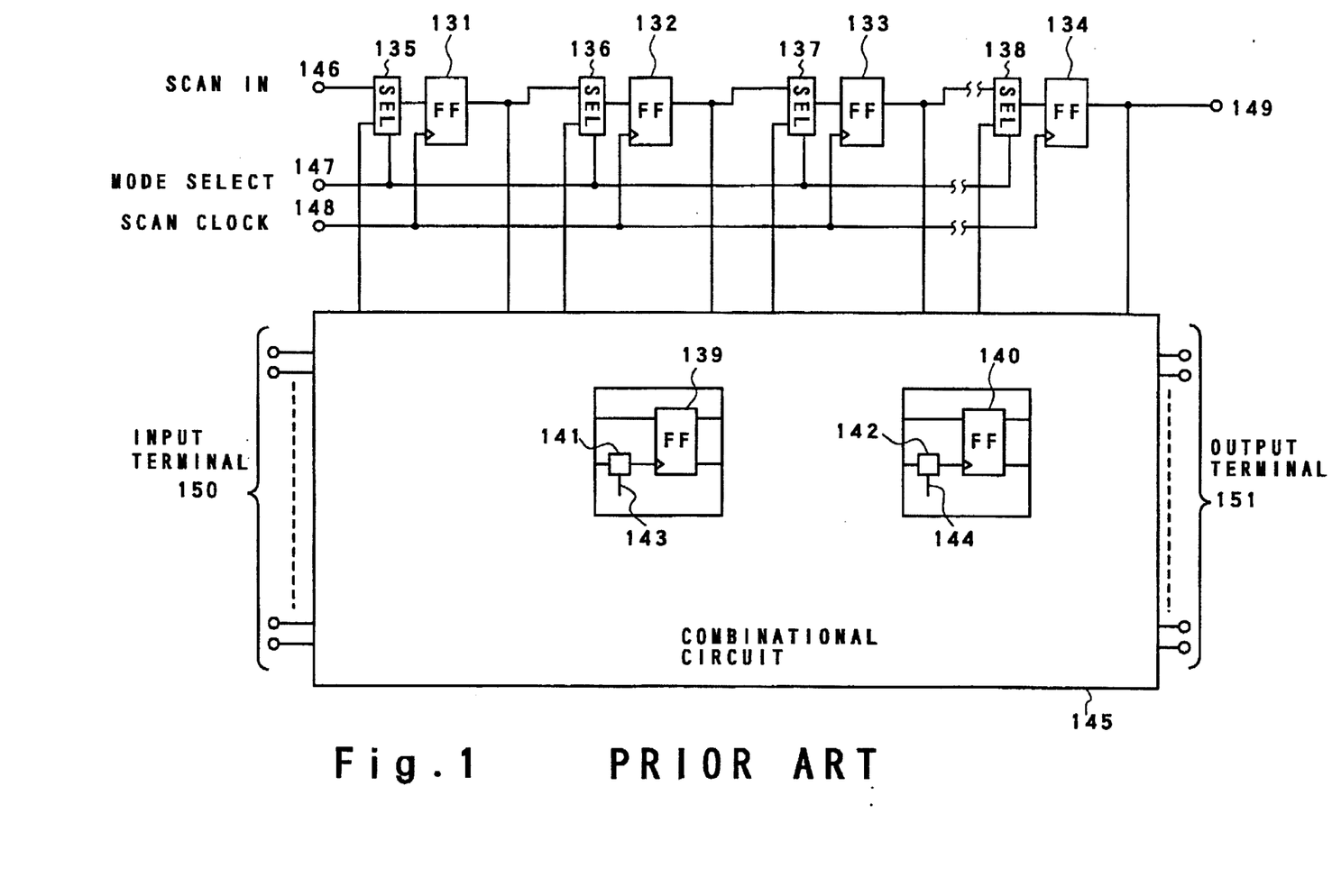
FIG. 1 is a block diagram showing the structure of a conventional semiconductor logic circuit employing a partial scan path test.

FIG. 1 is a block diagram showing a conventional semiconductor logic circuit device. Flip-flop circuits 131 to 134 constitute a shift register for a partial scan path test and each of selectors 135 to 138 is provided immediately before the data input of the corresponding one of the flip-flop circuits 131 to 134. In the conventional logic circuit, in order to solve the above problem, clock control circuits 141 and 142 are provided at the clock inputs of sequential circuits 139 and 140 other than the flip-flop circuits 131 to 134 to control clock signals to be supplied to the control inputs in accordance with signals 143 and 144, respectively.

However, in the conventional semiconductor logic circuit device shown in FIG. 1, since the clock control circuits 141 and 142 are respectively connected to the clock inputs of the sequential circuits 139 and 140, there is another problem in that the maximum operation speed of the logic circuit drops.

Figure 2:
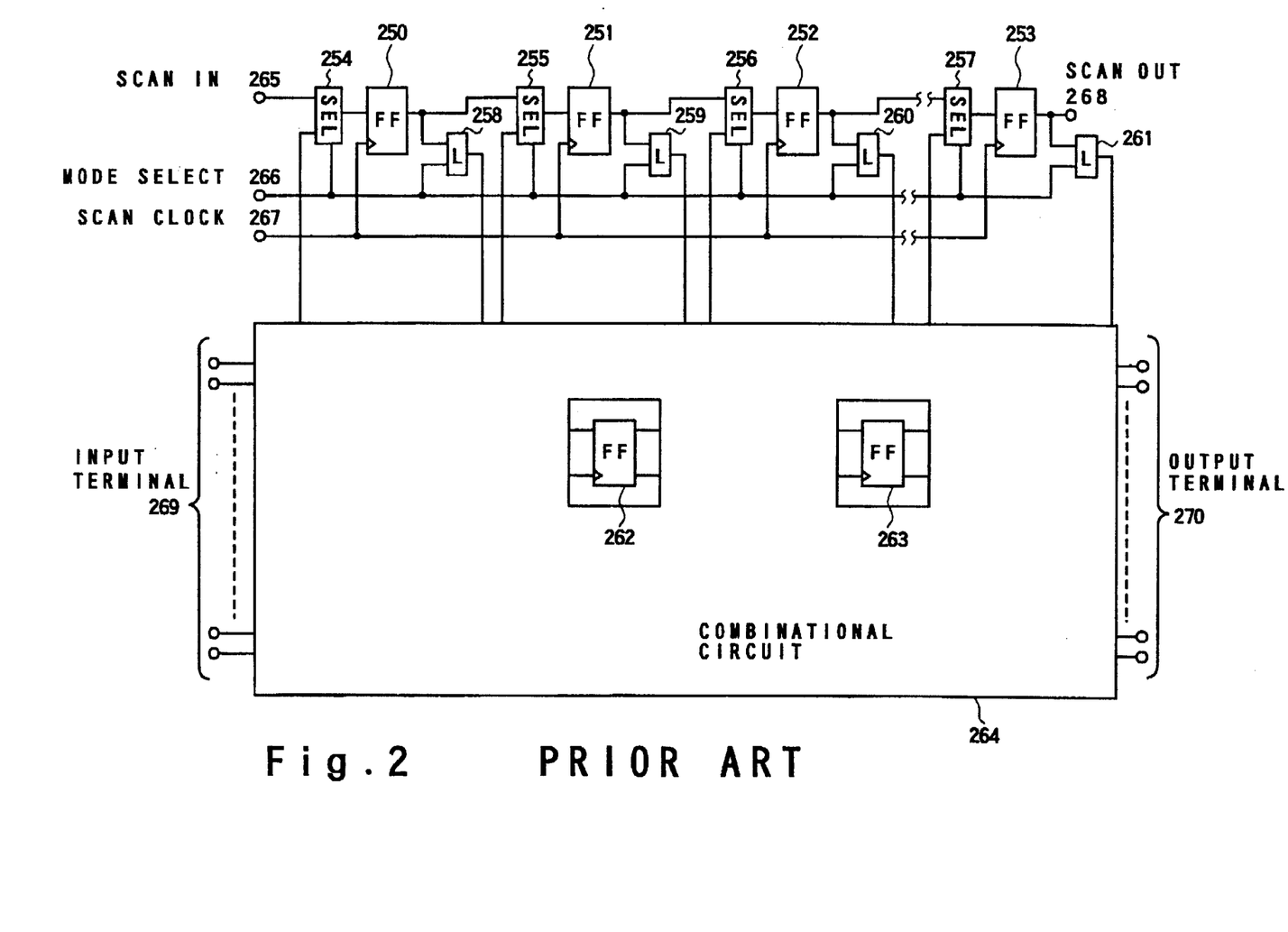
FIG. 2 is a block diagram showing the structure of another conventional semiconductor logic circuit employing a partial scan path test.

In order to solve the above problem, another conventional semiconductor logic circuit device is proposed. The structure of the logic circuit device is shown in FIG. 2. In FIG. 2, latches 258 to 261 are added to the output terminals of all flip-flop circuits 250 to 253 constituting a shift register for a partial scan path test, respectively, so that when the flip-flop circuits 250 to 253 operate as the shift register in the partial scan path test, the change of the outputs of the flip-flop circuits 250 to 253 is not transferred to sequential circuits 262 and 263.

However, there is still another problem in that the chip area of the whole semiconductor logic circuit device increases for the excess latches.

SUMMARY OF THE INVENTION

The present invention has, as an object, to provide a method for providing for a semiconductor logic circuit which includes a circuit for the partial scan path test without remarkable increase of the circuit area and delay in sequential circuits.

Another object of the present invention is to provide an apparatus performing the above method.

Further another object of the present invention is to provide a semiconductor logic circuit which includes a circuit for the partial scan test without remarkable increase of the circuit chip area and delay in sequential circuits.

In order to achieve the object, a semiconductor logic circuit designing apparatus according to the present invention includes a storage section for storing connection information of a semiconductor logic circuit to be designed or provided, a connection determining section for determining based on the connection information whether each of sequential circuits of the semiconductor logic circuit except for flip-flop circuits constituting a shift register for a partial scan path test is connected to each of the flip-flop circuits, and a changing section for selectively changing the connection information in accordance with the determining result. The change may be addition of a latch as a circuit element immediately after an output terminal of each of the one or more flip-flop circuits on a path between the output terminal of each of the one or more flip-flop circuits and each sequential circuit when it is determined that each control terminal of each sequential circuit is connected to the one or more flip-flop circuits.

The connection (circuit) information indicates the semiconductor logic circuit. In order to determine whether each of the flip-flop circuits is connected to any one of the sequential circuits, the tracing operation is performed based on the connection information. The tracing direction may be from each of the control inputs of each of the sequential circuits toward input terminals of the semiconductor logic circuit, or from each output of each of the flip-flop circuits toward output terminals of the semiconductor logic circuit. When the connection between the flip-flop and the sequential circuit is determined, a latch is added immediately after the output of flip-flop circuit. As a result, there can be obtained the semiconductor logic circuit in which any delay is not caused in the sequential circuits and a large chip area is not required for the partial scan test circuit.

The resultant semiconductor logic circuit according to the present invention includes:

a combinational circuit section;

a plurality of flip-flop circuits connected in series, for forming a partial scan path, an output of a last flip-flop circuit being connected to a scan-output terminal as one of system output terminals, and a clock terminal of each flip-flop being supplied with a clock signal from a scan-clock terminal as one of system input terminals;

a plurality of selectors respectively provided for the plurality of flip-flop circuits, wherein each of said plurality of selectors is provided before a corresponding flip-flop circuit, an input terminal of a first selector is connected to a scan-in terminal as one of the system input terminals, and each selector supplies one of an output of the previous stage flip-flop circuit or a scan-in signal from the scan-in terminal and an output of the combinational circuit section to the corresponding flip-flop circuit in accordance with a mode select signal from a mode-select terminal as one of the system input terminals;

sequential circuits; and circuit elements connected to the outputs of some of the plurality of flip-flop circuits and the mode-select terminal at the input side and directly or indirectly connected to a control terminal of each of one or more of the sequential circuits at the output side, for directly or

3 indirectly supplying the output of the flip-flop circuit connected thereto to the one or more sequential circuits in accordance with the mode select signal.

DESCRIPTION OF THE PREFERRED EMBODIMENTS

The present invention will be described below with reference to the accompanying drawings.

Figure 3:
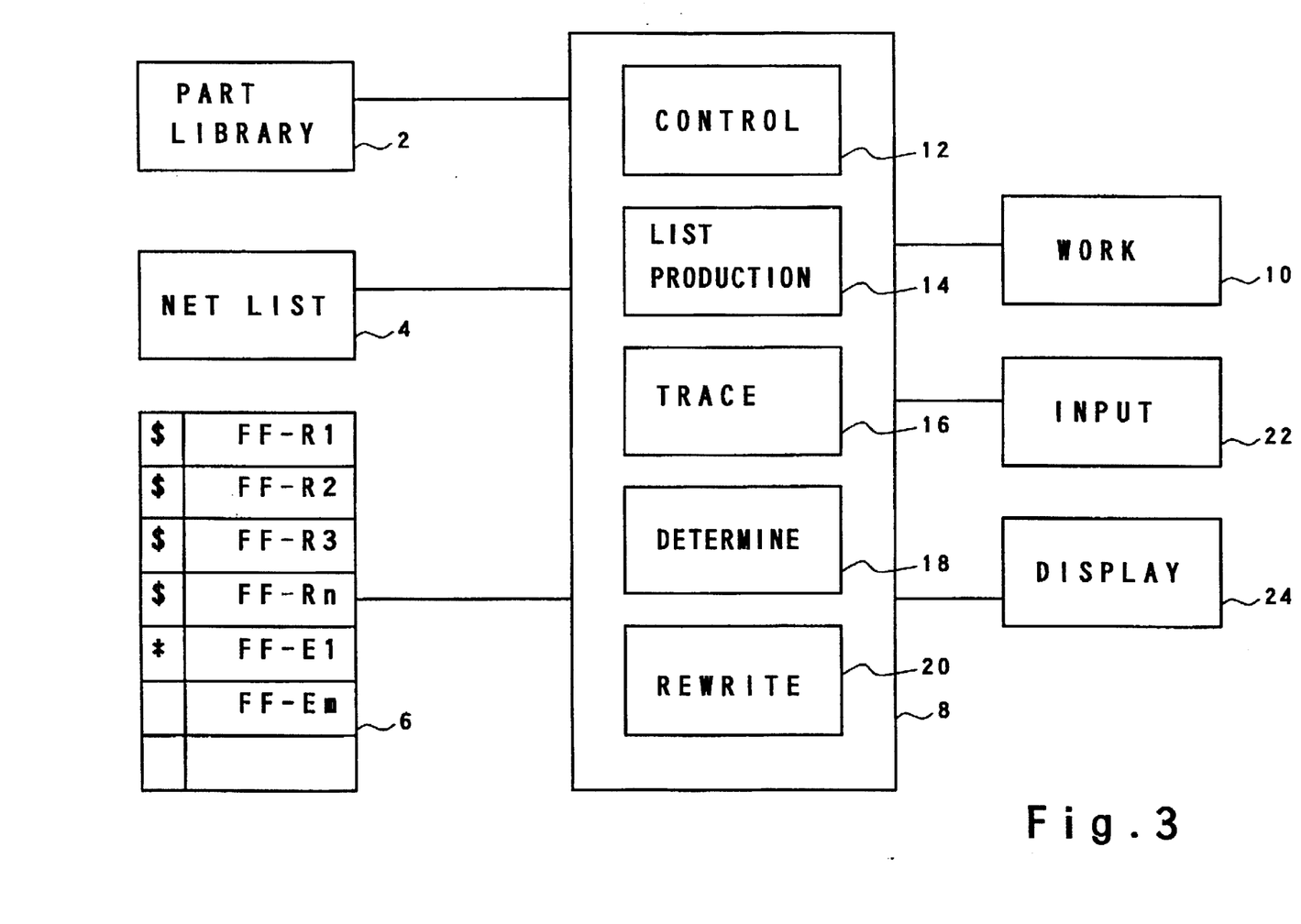
FIG. 3 is a block diagram showing the structure of an apparatus for providing a semiconductor logic circuit including a circuit for a partial scan test according to an embodiment of the present invention.

First, referring to FIG. 3, the structure of an apparatus for providing a semiconductor logic circuit device according to an embodiment of the present invention will be described below. The apparatus includes a part library 2, a net list 4, a sequential circuit table 6, a processing section 8, a work area 10, an input unit 22 and a display unit 24. The part library 2 stores part information indicative of the characteristics of each of parts such as the number of inputs, the number of outputs, and the operation speed. The net list 4 stores connection information indicative of connections between parts used in a semiconductor logic circuit to be designed or provided. The net list 4 may also includes the names of used parts in the connection information. In this case, the connection information functions as a circuit information. The sequential circuit table 6 stores a list of sequential circuits used in the semiconductor logic circuit. In the table 6, a symbol "$" is assigned to some of the sequential circuits, i.e., flip-flop circuits constituting a shift register for a scan path test and a symbol "*" is added to a sequential circuit to which trace processing is completed. The work area 10 is used for the trace processing. The input unit 22 is used for inputting commands or data and the display unit 24 is used for displaying the designed semiconductor logic circuit. The display unit 24 is also used for interaction with a user.

The processing section 8 includes a control section 12, a list producing section 14, a tracing section 16, a determining section 18 and rewriting section 20. The control section 12 controls the operation of the whole processing section 8 and the input unit 22 and the display unit 24. The list producing section 14 produces the sequential circuit table 6 in response to a table production instruction from the control section 12. The tracing section 16 traces connection paths from a control terminal of a sequential circuit designated by the control section 12 toward input terminals of the semiconductor logic circuit in response to a trace instruction from the control section 12. The determining section 18 determines in response to a determination instruction from the control section 12 whether or not a latch is already provided at the output of a flip-flop circuit when it is detected by the tracing section 16 that the control terminal of the sequential circuit is directly or indirectly connected to the flip-flop circuit. The rewriting section 20 rewrites the connection information in response to a rewrite instruction from the control section 12 to add a latch to the output of the flip-flop circuit when it is determined by the determining section 18 that the latch is not yet provided at the output of the flip-flop circuit.

Next, the operation of the semiconductor logic circuit providing apparatus according to the embodiment of the present invention will be described below.

Figure 5:
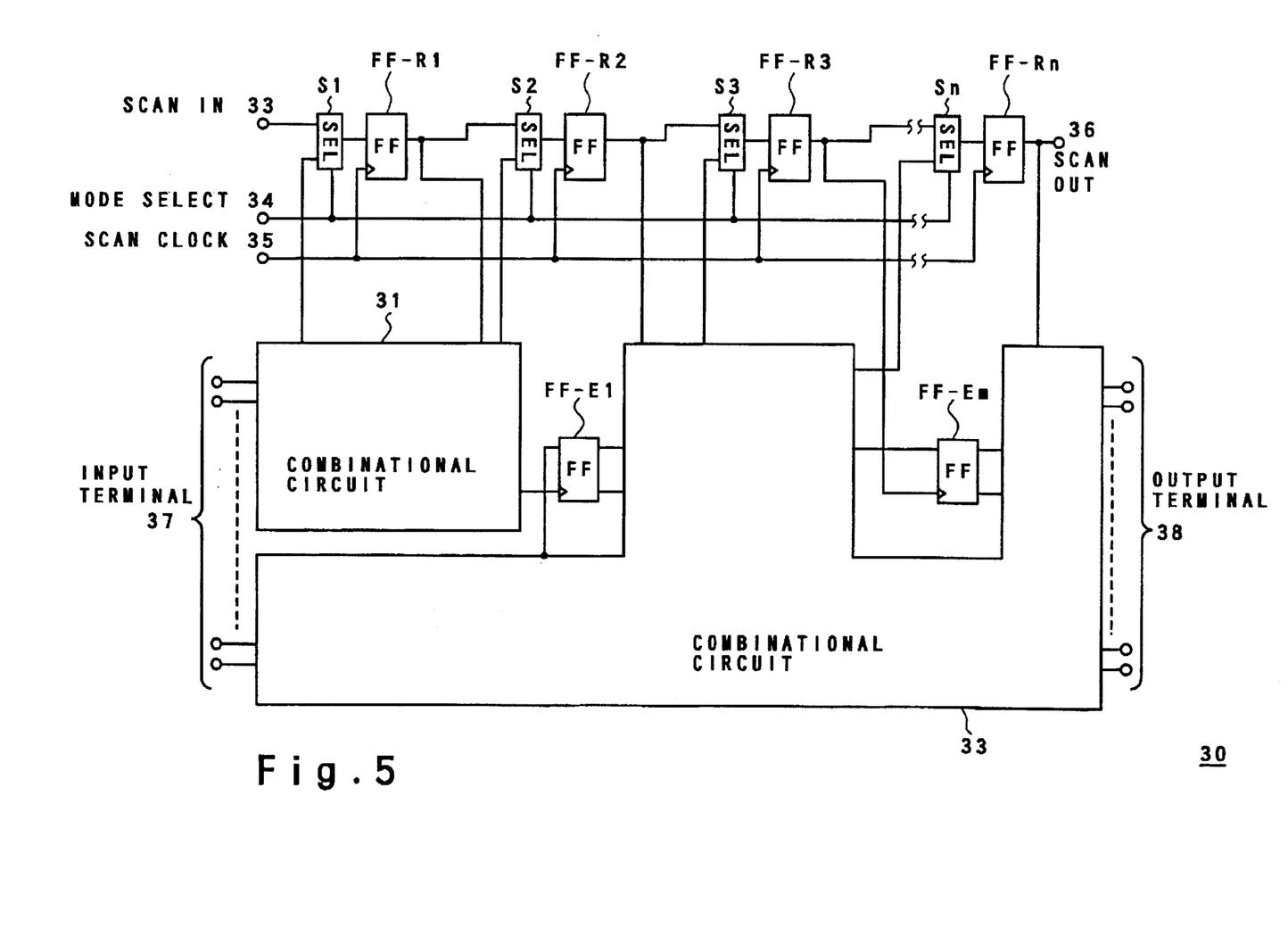
FIG. 5 is diagram for explaining the operation of the apparatus showing in FIG. 3.

In this embodiment, there is provided as the net list 4 the connection information indicative of the semiconductor logic circuit shown in FIG. 5. In this example, the semiconductor logic circuit 30 having a partial scan path test circuit includes combinational circuit sections 31 and 33. System input terminals 37 are connected to the sections 31 and 33 and system output terminals are connected to the section 33. A plurality of flip-flop circuits FF-R1 to FF-Rn are connected in series to constitute a shift register having n stages for the partial scan path test. The output of the last flip-flop circuit FF-Rn is connected to a scan-output terminal. In this embodiment, the output of each of the plurality of flip-flop circuits is connected to the combinational circuit 31 or 33. However, this is not essential. A clock terminal of each flip-flop circuit is supplied with a clock signal from a scan-clock terminal. A plurality of selectors S1 to Sn are respectively provided for the plurality of flip-flop circuits FF-R1 to FF-Rn such that the output of each of the plurality of selectors S1 to Sn is connected to the data input of the corresponding flip-flop circuit. One of the inputs of the first selector S1 is connected to a scan-in terminal, and one of the inputs of each of the remaining selectors S2 to Sn is connected to receive the output of the flip-flop circuit of the previous stage of the shift register. The control input of each selector is supplied with a mode select signal from a mode-select terminal. The other of the inputs of each selector is connected to the combinational circuit 31 or 33. The semiconductor logic circuit further includes sequential circuits FF-E1 to FF-Em such as flip-flop circuits. The data inputs of the sequential circuits FF-E1 and FF-Em are connected to the combinational circuits 31 and 33, respectively. Also, the outputs of the sequential circuits FF-E1 and FF-Em are connected to the combinational circuit 33. Further, the control terminal of the sequential circuit FF-E1 is indirectly connected to the output of the flip-flop circuit FF-R1 via the combinational circuit 31 and the control terminal of the sequential circuit FF-Em is directly connected to the output of the flip-flop circuit FF-R3. Therefore, the outputs of the flip-flop circuits FF-R2 and FF-Rn are not connected to any sequential circuit directly or indirectly. It should be noted that although there are two combinational circuits 31 and 33 in this example, it would cause no problem for the present invention if these circuits are regarded as a single combinational circuit.

Figure 4:
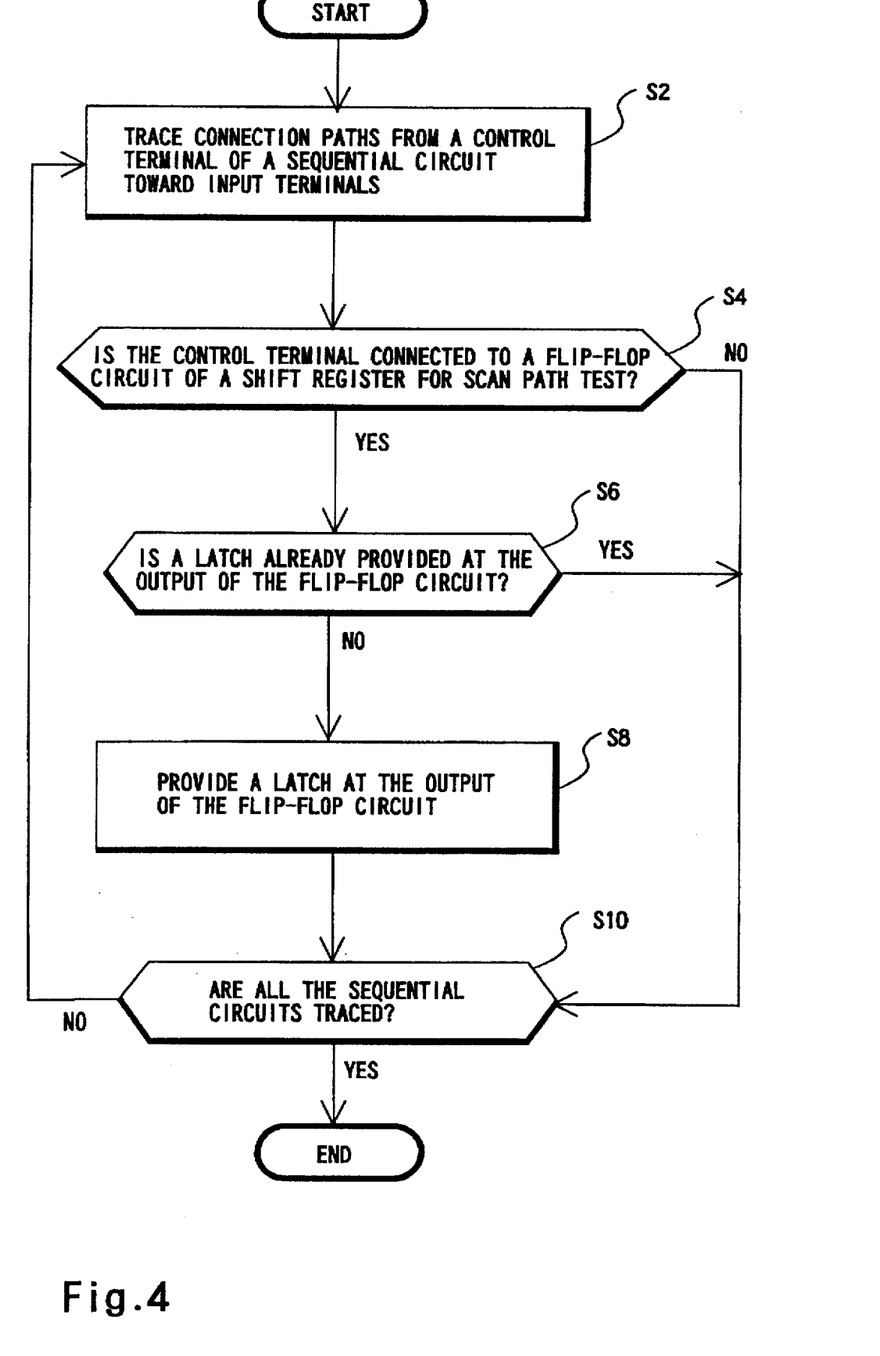
FIG. 4 is a flow chart showing the operation of the apparatus shown in FIG. 3.

In this state, when a modification command is inputted by a user via the input unit 22, the control section 12 issues the list production instruction to the list producing section 14 in a step S2 of FIG. 4. The list producing section 14 searches the connection information 4 for sequential circuits FF-R1 to FF-Rn and FF-E1 to FF-Em in response to the list production instruction to produce the sequential circuit table 6. As described above, the flip-flop circuits FF-R1 to FF-Rn are included in the shift register but the remaining sequential circuits FF-E1 and FF-Em such as flip-flop circuits are not included in the shift register. The symbol "$" is assigned to each of the flip-flop circuits FF-R1 to FF-Rn and no symbol is assigned to each of the sequential circuits FF-E1 to FF-Em.

When the table 6 is produced, the control section 12 issues the trace instruction to the tracing section 16 in a step S4 of FIG. 4. The tracing section 16 chooses one of the sequential circuits FF-E1 to FF-Em, the sequential circuit FF-E1 in this case, from the table 6 and traces all connection paths from the control terminal of the sequential circuit FF-E1 toward the system input terminals 37 until reaching any one of the flip-flop circuits FF-R1 to FF-Rn or any one of the system input terminals. Since one connection path from the control terminal of the sequential circuit FF-E1 is indirectly connected to the output of the flip-flop circuit FF-R1, the tracing section 16 writes the name of the flip-flop circuit FF-R1 in the work area 10 and informs the control section 12 that the connection path to the flip-flop circuit FF-R1 is present.

Figure 6:
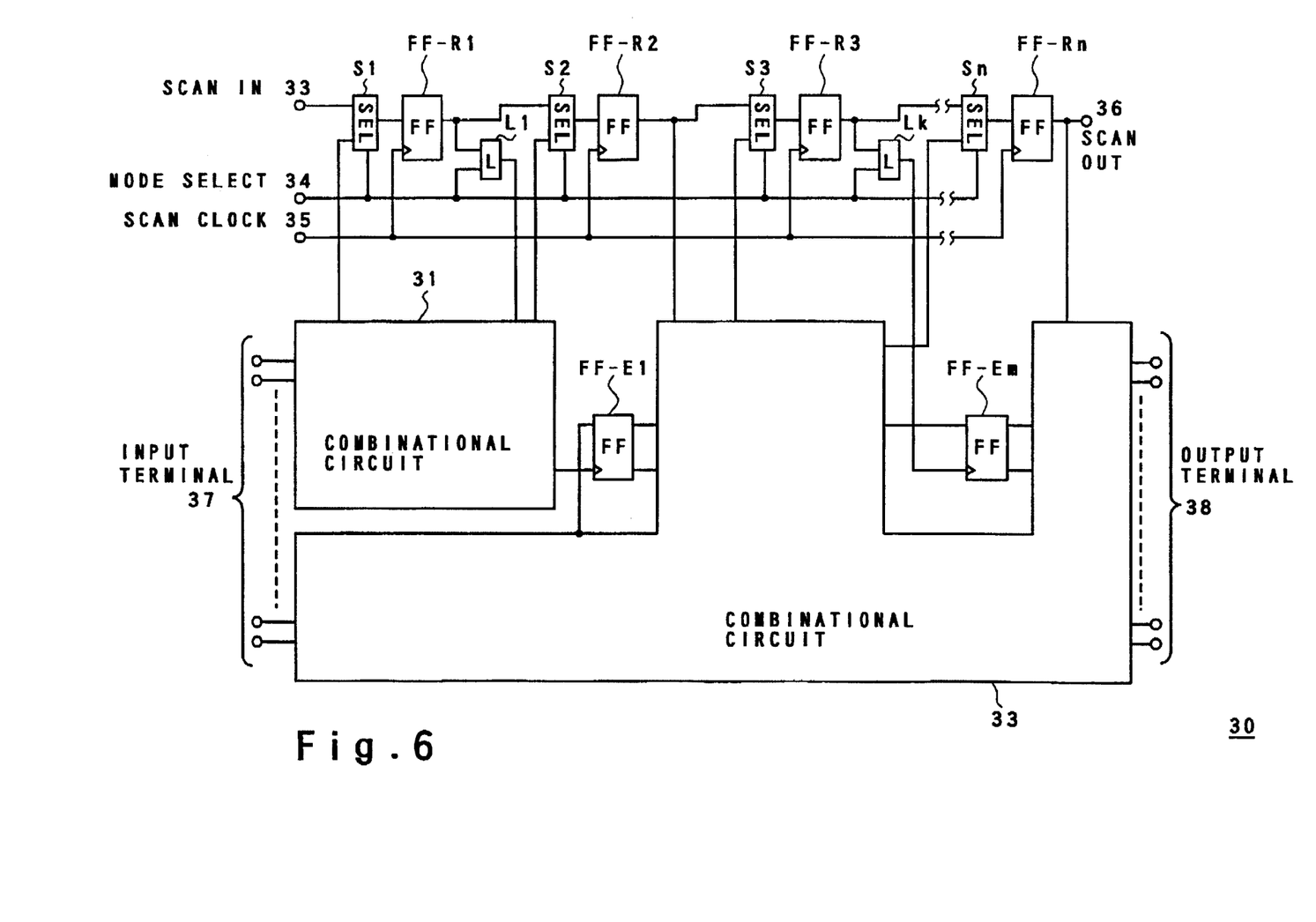
FIG. 6 is a diagram for explaining the operation of the apparatus showing in FIG. 3.

The control section 12 issues a determination instruction to the determining section 18 in a step S6 in response to the information. The control section 12 does not issue the determination instruction when the information is not received and performs a step S10 immediately. The determining section 18 refers to the work area 10 to get the name of the flip-flop circuit FF-R1 and refers to the connection information 4 to determine whether or not a latch is already provided at the output of the flip-flop circuit FF-R1. When the latch is already provided, the determining section 18 informs the control section 12. In this case, the control section 12 performs a step S10 immediately. Because an latch is not provided in this case, the control section 12 issues a rewrite instruction to the rewriting section 20. The rewriting section 20 adds a latch L1 at the output of the flip-flop circuit FF-R1 as shown in FIG. 6. More particularly, the latch L1 is added such that one of the inputs of the latch L1 is connected to the output of the flip-flop circuit FF-R1, the other is connected to the mode scan terminal, and the output of the latch L1 is connected to the sequential circuit FF-E1 via the combinational circuit 31. In other words, the rewriting section 20 rewrites or changes the connection information 4 as described above.

In a step S10, the control section 12 determines whether or not all the sequential circuits are tested or traced. When all the sequential circuit are traced, the modifying result is displayed on the display unit 24 and the processing completed. When any sequential circuit is remains, the processing goes back to the step S2 to continue the processing for the remaining sequential circuits. In this case, as the sequential circuit FF-Em remains, the step S2 is executed again. As a result, since the sequential circuit FF-Em is directly connected to the flip-flop circuit FF-R3, a latch Lk is added at the output of the flip-flop circuit FF-R3 as shown in FIG. 6.

Thereafter, the semiconductor logic circuit having the structure as shown in FIG. 6 is produced and tested by use of the partial scan path. The test is performed as follows.

First, the active mode select is supplied to the mode select terminal and a test bit pattern composed of a plurality of bits is supplied to the scan-in terminal in series. In this state, the scan clock signal is supplied to the scan clock terminal so that the test bit pattern is shifted from the flip-flop circuit FF-R1 to the flip-flop circuit FF-Rn one bit by one bit synchronously with the scan clock signal. At this time, since the mode select signal is active, the latch does not output the output of the corresponding flip-flop circuit to the combinational circuit 31 or 33. Therefore, the states of the sequential circuits FF-E1 to FF-Em are not changed. When the mode select signal is made inactive, each selector outputs a signal from the combinational circuit 31 or 33 to the corresponding flip-flop circuit and the output of the corresponding flip-flop circuit is supplied to the combinational circuit 31 or 33 via the corresponding latch with no delay. The operation result is presented at the output terminals 38 and held in the flip-flop circuits FF-R1 to FF-Rn. When a next test bit pattern is set to the flip-flop circuits FF-R1 to FF-Rn in the same manner as described above, the held operation result is outputted from the scan-out terminal in series. The user can determine from the output from the output terminals 38 and the output from the scan-out terminal 36 whether the semiconductor logic circuit operates correctly.

Next, the semiconductor logic circuit designing apparatus according to another embodiment of the present invention will be described. The apparatus according to this embodiment has the same structure as that of the above embodiment but the operation is different from the above embodiment. The operation will be described with reference to FIG. 7.

Figure 8:
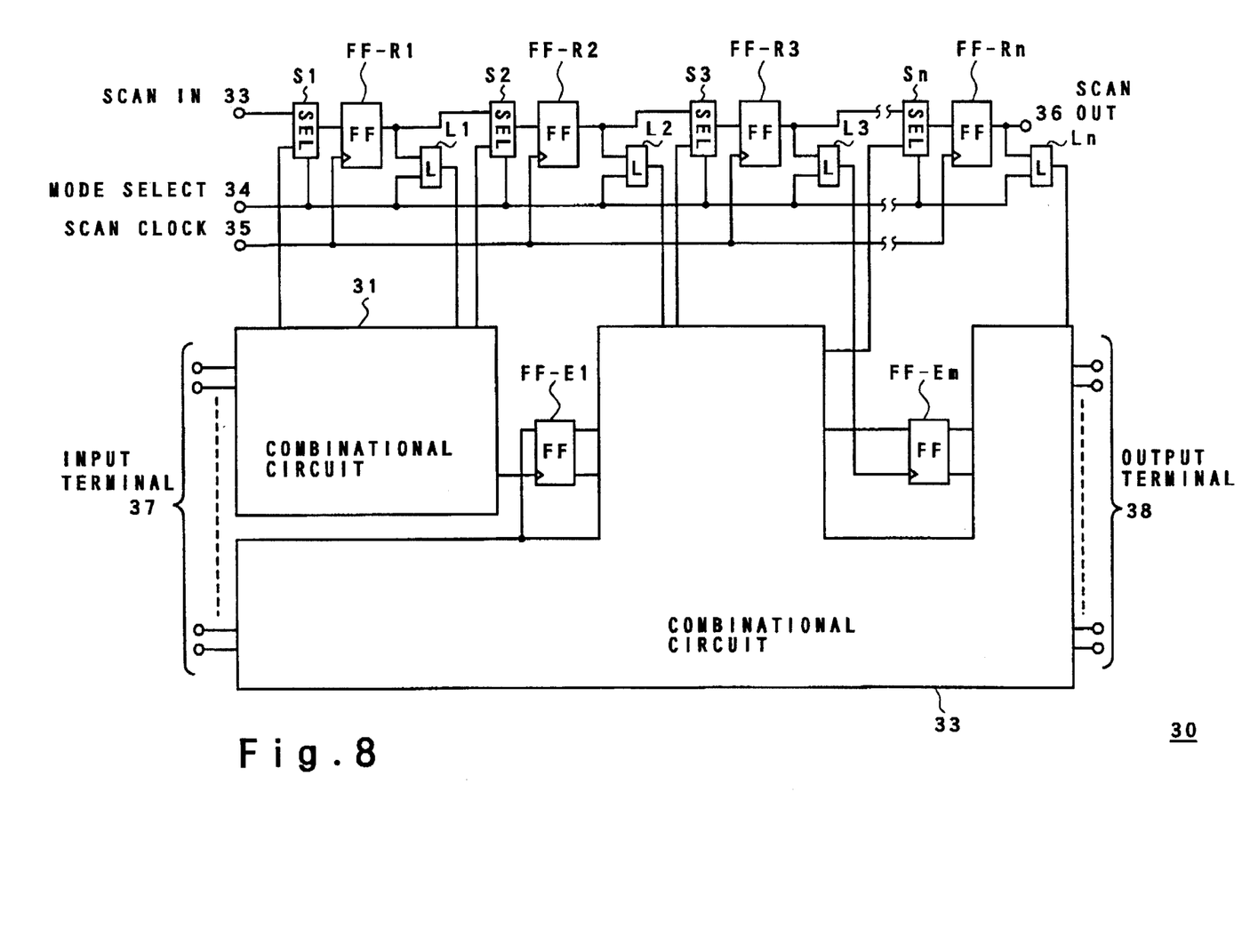
FIG. 8 is a diagram for explaining the operation of the apparatus showing in FIG. 3.

In this embodiment, there is provided as the net list 4 the connection information indicative of the semiconductor logic circuit as shown in FIG. 8. That is, a latch is provided at the output of each of the flip-flop circuits constituting a shift register for the partial scan path test.

In this state, when the modification command is inputted by a user via the input unit 22, the control section 12 issues the list production instruction to the list producing section 14 in a step S22. The list producing section 14 searches the connection information 4 for sequential circuits FF-R1 to FF-Rn and FF-E1 to FF-Em in response to the list production instruction to produce the sequential circuit table 6, as in the first embodiment.

Figure 7:
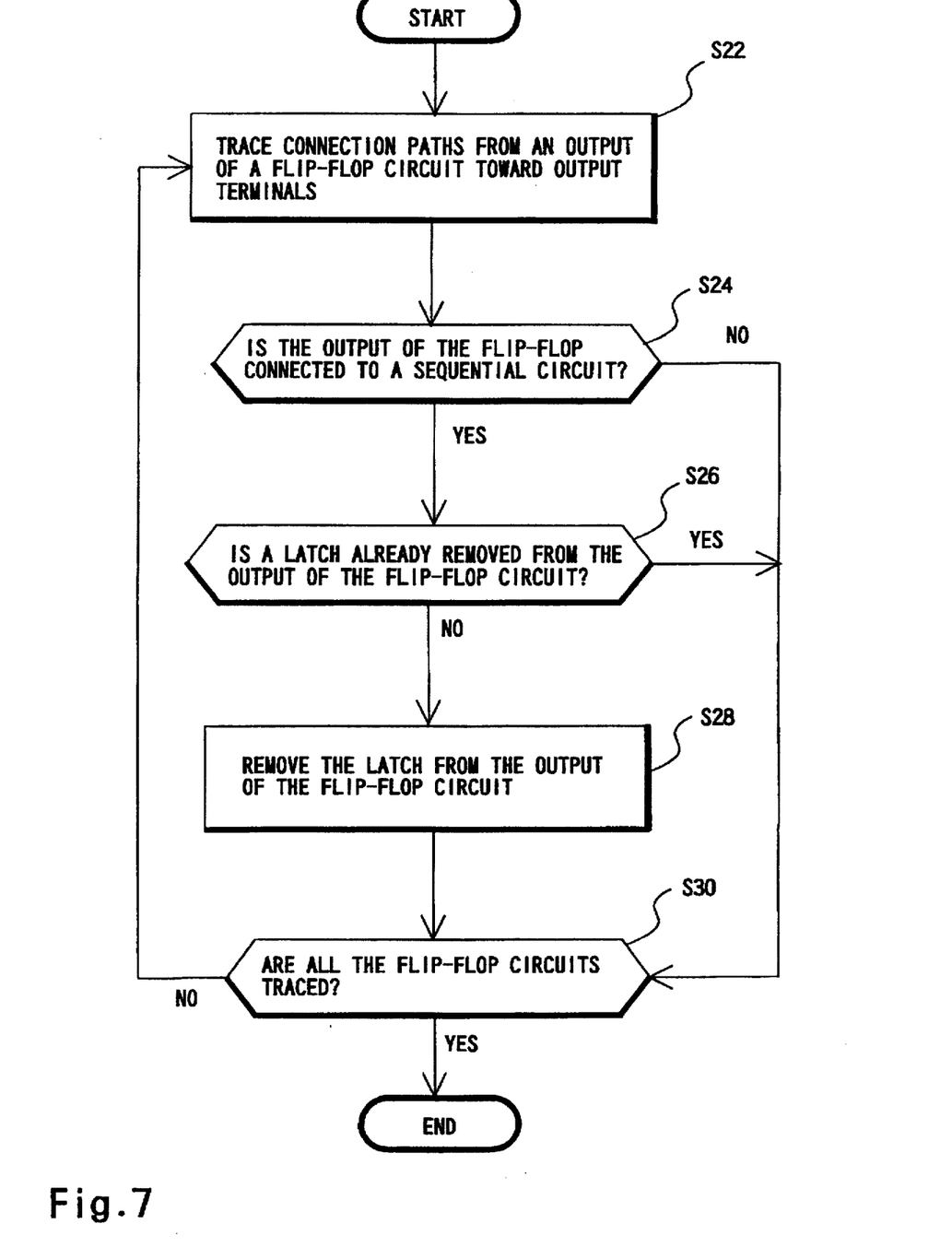
FIG. 7 is a flow chart showing the operation of an apparatus according to another embodiment according to the present invention.

When the table 6 is produced, the control section 12 issues the trace instruction to the tracing section 16 in a step S24 of FIG. 7. The tracing section 16 chooses one of the flip-flop circuits FF-R1 to FF-Rn, the flip-flop circuit FF-R1 in this case, from the table 6 and traces all connection paths from the output terminal of the flip-flop circuit FF-R1 toward the system output terminals 38 until reaching any one of the sequential circuits FF-E1 to FF-Em or any one of the system output terminals. Since one connection path from the control terminal of the flip-flop circuit FF-R1 is indirectly connected to the control terminal of the sequential circuit FF-E1, the tracing section 16 writes the name of the flip-flop circuit FF-R1 in the work area 10 and informs to the control section 12 that the connection path to one of the sequential circuits FF-E1 to FF-Em is present.

The control section 12 does not issue the determination instruction when this information is received and performs a step S30 immediately.

In the step S30, the control section 12 determines whether or not all the flip-flop circuits are traced. In this case, since there remain many flip-flop circuits, the step S22 is executed again.

The processing is performed as described above. In this case, the flip-flop circuit FF-R2 is chosen and the tracing processing is performed in the step S24. As a result, it is determined that the output of the flip-flop circuit FF-R2 is connected to one of the output terminals for each connection path not in the sequential circuit. The tracing section 16 writes the name of flip-flop circuit FF-R2 in the work area 10 and informs the control section 12.

The control section 12 issues a determination instruction to the determining section 18 in a step S26 in response to the information. The determining section 18 refers to the work area 10 to get the name of the flip-flop circuit FF-R2 and refers to the connection information 4 to determine whether a latch is already removed from the output of the flip-flop circuit FF-R2. When the latch is already removed, the determining section 18 informs the control section 12. In this case, the control section 12 performs a step S30 immediately. Because the latch is not yet removed in this case, the control section 12 issues a rewrite instruction to the rewriting section 20. The rewriting section 20 removes a latch L2 from the output of the flip-flop circuit FF-R2 as shown in FIG. 6. More particularly, the output terminal of the flip-flop circuit FF-R2 has latch L1 added such that one of inputs of the latch L1 is connected to the combinational circuit 33.

Further, the step S22 is executed via the step S30 again and the latch is removed from the output terminal of the flip-flop circuit FF-Rn. In this manner, the connection information shown in FIG. 6 can be obtained from the connection information shown in FIG. 8.

As described above, according to the present invention, a semiconductor logic circuit having a circuit for the partial scan path test can be obtained without remarkable increase of a chip area and any delay in the operation.

What is claimed is:

1. An apparatus for providing a semiconductor logic circuit including a shift register circuit for a partial scan path test, comprising:
    storage means for storing connection information indicative of connections between parts in a semiconductor logic circuit to be provided, said semiconductor logic circuit including a shift register circuit and sequential circuits, said shift register circuit being composed of a plurality of flip-flop circuits connected in series, and each of said sequential circuits having a control input terminal;
    connection determining means for determining based on said connection information whether an output terminal of each of said plurality of flip-flop circuits is directly or indirectly connected to said control terminal of either one of said sequential circuits; and
    changing means for changing, when it is determined by said connection determining means that said output terminal of each of first specific ones of said plurality of flip-flop circuits is directly or indirectly connected to said control terminal of either one of said sequential circuits, said connection information so that a latch is added immediately after said output terminal of each of said first specific flip-flop circuits each having said output terminal directly or indirectly connected to said control terminal of either one of said sequential circuits.

2. An apparatus according to claim 1, wherein said connection determining means includes means for referring to said connection information to trace each of connection paths from said control terminal of each of said sequential circuits toward system input terminals of said semiconductor logic circuit until reaching one of said system input terminals or one of said output terminals of said plurality of flip-flop circuits.

3. An apparatus according to claim 2, wherein said connection determining means comprises:
    list producing means for referring to said connection information to list said sequential circuits as listed sequential circuits; and
    tracing means for tracing the connection paths sequentially with respect to said listed sequential circuits one by one.

4. An apparatus according to claim 1, wherein said connection determining means includes means for referring to said connection information to trace each of connection paths from said output terminal of each of said plurality of flip-flop circuits toward system output terminals of said semiconductor logic circuit until reaching one of the system output terminals or said control terminal or either one of said sequential circuits.

5. An apparatus according to claim 4, wherein said connection determining means comprises:
    list producing means for referring to said connection information to list said flip-flop circuits as listed flip-flop circuits; and
    tracing means for tracing the connection paths sequentially with respect to said listed flip-flop circuits one by one.

6. An apparatus according to claim 1, wherein said changing means includes:
    additional changing means for changing, when it is determined by said connection determining means that said output terminal of each of second specific ones of said plurality of flip-flop circuits is not directly or indirectly connected to said control terminal of any one of said sequential circuits,
    said connection information so that a latch is removed from said output terminal of each of said second specific flip-flop circuits, if said latches are connected to said output terminals of said second specific flip-flop circuits.

7. An apparatus according to claim 1, wherein said control terminal is one of a clock terminal, a set terminal and a reset terminal of each of said sequential circuits.

8. A method of designing a semiconductor logic circuit comprising the steps of:
    providing circuit information indicative of the semiconductor logic circuit which includes flip-flop circuits connected in series and a combinational circuit including sequential circuits, said flip-flop circuits constituting a shift register for a partial scan path test;
    determining based on said circuit information whether an output terminal of each of said flip-flop circuits is directly or indirectly connected to a control terminal of either one of said sequential circuits; and
    rewriting said circuit information such that a latch is added immediately after said output terminal of each of first specific ones of said flip-flop circuits when it is determined that said output terminal of each of said first specific flip-flop circuits is directly or indirectly connected to said control terminal of either one of said sequential circuits.

9. A method according to claim 8, wherein said rewriting step includes rewriting said circuit information such that a latch is not provided immediately after said output terminal of each of second specific ones of said flip-flop circuits when said output terminal of each of said second specific flip-flop circuits is neither directly nor indirectly connected to any of said sequential circuits.

10. A method according to claim 8, wherein said determining step includes:
    tracing based on said circuit information, connection paths from said control terminal of each of said sequential circuits toward system input terminals of said semiconductor logic circuit until reaching one of the system input terminals or said output terminal of either one of said flip-flop circuits.

11. A method according to claim 10, wherein said tracing step comprises:
referring to said circuit information to list said sequential circuits as listed sequential circuits; and
tracing the connection paths with respect to each of said listed sequential circuits.

12. A method according to claim 8, wherein said determining step includes:
tracing based on the circuit information, connection paths from said output terminal of each of said flip-flop circuits toward system output terminals of said semiconductor logic circuit until reaching one of the system output terminals or said control terminal of either one of said sequential circuits.

13. A method according to claim 12, wherein said tracing step comprises:
referring to said circuit information to list said flip-flop circuits as listed flip-flop circuits; and
tracing the connection paths with respect to each of said listed flip-flop circuits.

* * * * *